United States Patent [19]
Watanabe et al.

[11] 3,983,475
[45] Sept. 28, 1976

[54] FREQUENCY SELECTIVE DETECTING SYSTEM FOR DETECTING ALTERNATING MAGNETIC FIELDS

[75] Inventors: Teruji Watanabe, Niza; Shizuo Suzuki; Kazuomi Yamamura, both of Yokohama; Yoshinao Iwamoto, Fujimi, all of Japan

[73] Assignee: Kokusai Denshin Denwa Kabushiki Kaisha, Japan

[22] Filed: Dec. 30, 1974

[21] Appl. No.: 537,417

[30] Foreign Application Priority Data
Jan. 10, 1974 Japan.................. 49-5638

[52] U.S. Cl............................... 324/43 R
[51] Int. Cl.$^2$......................... G01R 33/02
[58] Field of Search.............. 324/43 R, 47

[56] References Cited
UNITED STATES PATENTS
3,400,328  9/1968  Penn et al.............. 324/43 R
3,622,873  11/1971  Stine et al............. 324/43 R OTHER PUBLICATIONS
Oshima et al., High Sensitivity Plated Wire Sensor, IEEE Trans. on Mag., Sept. 1971, pp. 436–437.

Primary Examiner—Robert J. Corcoran
Attorney, Agent, or Firm—Robert E. Burns; Emmanuel J. Lobato; Bruce L. Adams

[57] ABSTRACT

A system for detecting an AC magnetic field of a desired frequency using a magnetic sensing element of the parametrically excited second harmonic oscillator, in which a reference signal having a repetition period substantially equal to the repetition period of the AC magnetic field is adopted for synchronous detection of the detected output of the magnetic sensing element, and in which a current proportional to the intensity of a noise magnetic field is applied to the oscillation winding of the magnetic sensing element to lessen the influence of the noise magnetic field to greatly improve the SN ratio of the detected signal.

2 Claims, 22 Drawing Figures

FREQUENCY SELECTIVE DETECTING SYSTEM FOR DETECTING ALTERNATING MAGNETIC FIELDS

This invention relates to a system for detecting an AC magnetic field of a desired frequency which employs a magnetic sensing element of the parametrically excited second harmonic oscillator type.

Conventional types of magnetic field detecting systems employing a magnetic sensing element of the parametrically excited second harmonic oscillator yield type respond to the influence of a DC disturbing noise magnetic field such as earth magnetism and a DC disturbing noise magnetic field emanating from a power transformer or the like, so that the conventional systems have a low signal-to-noise ratio for an AC magnetic field signal to be detected and encounter a problem in improving the accuracy of the measurement.

An object of this invention is to provide an AC magnetic field detecting system capable of performing detection of an AC magnetic field at a high signal-to-noise ratio and with an enhanced reliability.

In accordance with the principle of this invention, an AC magnetic field detecting system using as a magnetic sensing element of parametrically excited second harmonic oscillator adopts a reference signal having a repetition period substantially equal to the repetition period of the AC magnetic field to be detected, and a current proportional to the intensity of the noise magnetic field is applied to the oscillation winding of the magnetic sensing element to lessen the influence of the noise magnetic field.

The principle, construction and operation of the system of this invention will be clearly understood from the following detailed description taken in conjunction with the accompanying drawings, in which.

Figure 1:
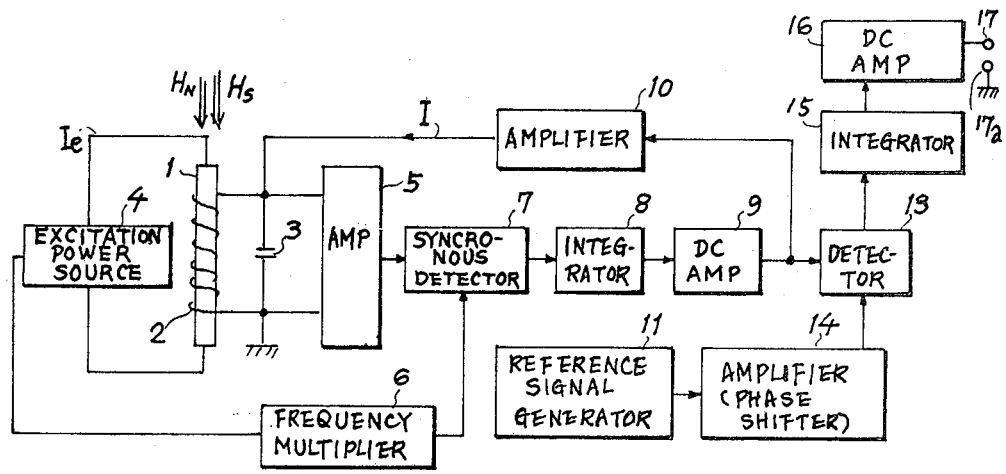
FIG. 1 is a block diagram illustrating an example of the circuit construction of the AC magnetic field detecting system of this invention.

With reference to FIG. 1, the basic construction of an embodiment of the magnetic field detecting system of this invention will now be described. Reference numeral 1 indicates a magnetic wire comprising a conductor and a magnetic thin film deposited thereon and having the easy axis of magnetization in its circumferential direction. The conductor is supplied with an exciting current i.e. from an excitation power source 4. Reference numeral 2 designates an oscillation winding; and 3 represents a capacitor. The oscillation winding 2 and the capacitor 3 consititute a resonance circuit which resonates with a frequency (2f) twice as high as that (f) of the exciting current, and the thin film magnetic wire 1, the oscillation winding 2 and the capacitor 3 form a parametrically excited magnetic field detecting element (hereinafter referred to as the parametric magnetic sensor). Reference numeral 5 denotes an amplifier, whose output is supplied to a balanced synchronous detector 7 through an unbalance to balance converter incorporated with the amplifier 5. Reference numeral 4 identifies an excitation power source. The frequency of the exciting current from the excitation power source 4 is doubled by a frequency multiplier 6 and then applied as a frequency and phase reference signal to the balanced synchronous detector 7. Reference numeral 8 shows an integrator having, for example, an integration time constant $\tau_1$ shorter than a repetition period $T_s$ of an AC signal magnetic field to be detected; and 9 refer to a DC amplifier. Reference numeral 10 indicates an amplifier employed for impedance matching, which is actuated so that a current I proportional to the output of the DC amplifier 9 is negatively fed back to the oscillation winding 2 of the parametric magnetic sensor to thereby cancel a magnetic field applied from the outside to the magnetic film of the oscillation winding 2 in its axial direction. Reference numeral 11 designates a reference signal generator, which generates a reference signal having a repetition period substantially equal to the repetition period $T_s$ of the AC signal magnetic field to be detected. Reference numeral 14 identifies an amplifier including a phase shifter, which amplifies the signal from the generator 11 and suitably controls its phase, and the output from which is applied as a reference signal to a detector 13. Reference numeral 15 denotes an integrator having an integration time constant $\tau_2$ longer than the repetition period $T_s$ of the signal magnetic field; 16 represents a DC amplifier; and 17 and 17a show output terminals.

Figure 2A:
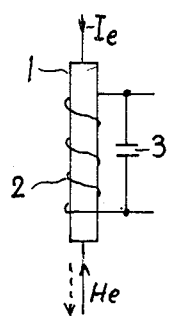
FIGS. 2A, 2B, 2C and 2D are respectively, a schematic view, a vector diagram and waveform diagrams explanatory of the second harmonic oscillation mechanism of the magnetic sensing element used in this invention.
Figure 2B:
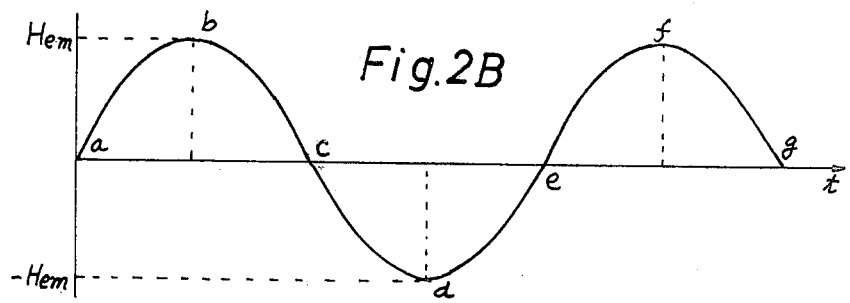
Figure 2C:
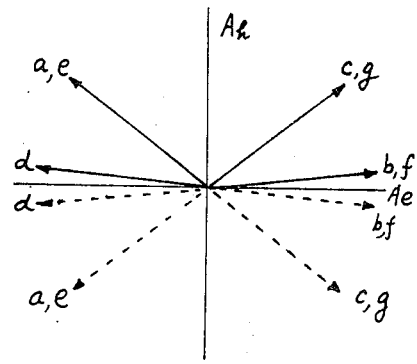
Figure 2D:
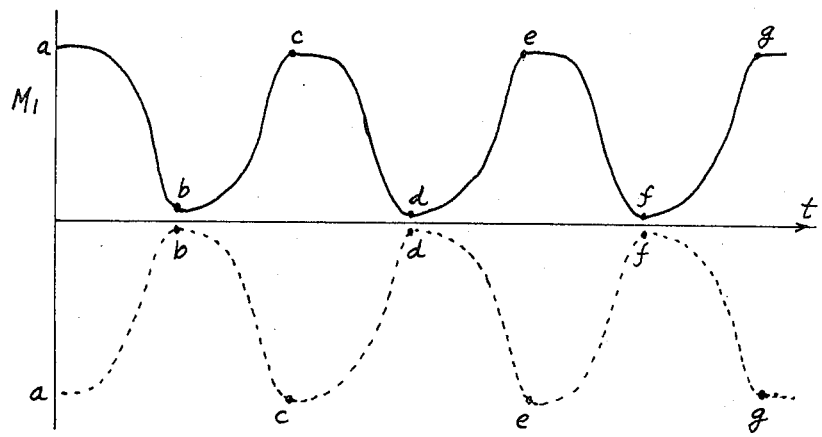

With reference to FIGS. 1 and 2A, 2B, 2C and 2D, the operation of the magnetic field detecting system of this invention will hereinafter be described in detail. An exciting current $I_e$ is flowed in the core conductor of the parametric magnetic sensor shown in FIG. 2A to apply, to the magnetic wire 1 in the direction of its easy axis of magnetization (in the circumferential direction) an alternating magnetic field as shown in FIG. 2B whose maximum value $H_{em}$ is larger than the value of a switching magnetic field of the magnetic wire 1. In FIG. 2B, reference characters a, c, e and g indicate instants when the above alternating magnetic field becomes zero; b and f designate instants when the alternating magnetic field exhibits it maximum value; and d shows an instant when the alternating magnetic field exhibits its minimum value. FIG. 2C illustrates time variations of the magnetization vector corresponding to respective instantaneous values of the alternating magnetic field in the magnetic thin film, in a case where the external magnetic field $H_e$ applied to the magnetic wire 1 of the parametric magnetic sensor in its axial direction (in the direction of its hard axis of magnetization $A_h$) is negative or positive. The solid lines show the cases where the external magnetic field $H_e$ is negative, and the broken lines show the cases where the external magnetic field is positive. In FIG. 2C, a reference character $A_e$ indicates the direction of the easy axis of magnetization (the circumferential direction) of the magnetic wire; and $A_h$ indicates the direction of the hard axis of magnetization (the lengthwise direction) of the magnetic wire 1. FIG. 2D shows the time variations of the instantaneous component $M_1$ of the magnetization vector $A_h$ in FIG. 2C. The voltage induced across the oscillation winding 2 is proportional to the derivative with respect to time of the magnetic flux interesting with the oscillation winding. Since the magnetic flux intersecting with the oscillation winding 2 is proportional to the intensity of the magnetization vector in the lengthwise direction of the magnetic wire 1, the derivative with respect to time of $M_1$ shown in FIG. 2D is proportional to the voltage induced in the oscillation winding. As is readily seen from FIG. 2D, the waveform of the time differentiation of the component $M_1$ contains the second harmonic component of the waveform of the excitation magnetic field shown in FIG. 2B. If the resonance circuit formed by the oscillation winding 2 and the capacitor 3 is resonant with the frequency $2f$ twice the frequency $f$ of the excitation magnetic field and if Q of the resonance circuit is sufficiently high, only the second harmonic voltage is derived across the oscillation winding 2. In this case, as is evident from FIG. 2D, if the polarity of the external magnetic field $H_s$ is reversed, the phase of the second harmonic voltage across the oscillation winding changes by 180°. Upon induction of such a second harmonic voltage in the oscillation winding 2, a resonance current of that second harmonic frequency flows in the resonance circuit. Due to the alternating magnetic field of the frequency twice that of the excitation magnetic field generated in the magnetic wire in its lengthwise direction, the second harmonic voltage is produced again in the oscillation winding 2. This is equivalent to the result of a positive feedback action so that the second harmonic voltage is produced across the oscillation winding 2.

Figure 3:
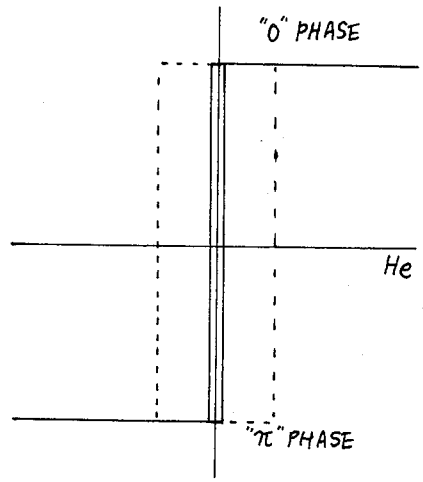
FIG. 3 is a characteristic diagram illustrating hysteresis loops relating to an external magnetic field intensity and the phase of a second harmonic oscillation voltage.

FIG. 3 shows a hysteresis characteristic between the intensity of the external magnetic field applied to the magnetic wire and the phase of the second harmonic voltage induced in the oscillation winding 2 of the magnetic sensor. In FIG. 3, the broken line indicates a characteristic in a case where the excitation current $I_e$ in FIG. 1 is continuously flowed, and the solid line indicates a characteristic in a case where the excitation current $I_e$ is intermittently flowed by keying at suitable time intervals. In case of continuous excitation, a DC component of $M_1$ determined in accordance with the polarity of the external magnetic field is produced to generate a reverse magnetic field $H_d$. Accordingly, even if the polarity of the external magnetic field is inverted at an instant, the direction of the magnetic field present in the oscillation winding does not change unless the absolute value of the intensity of the external magnetic field when inverted is larger than $H_d$, so that the phase of the second harmonic voltage also does not change. Consequently, such a large hysteresis loop as shown in FIG. 3 is obtained. On the other hand, in case of intermittent excitation, excitation temporarily stops, so that the magnetization vector is directed in the direction of the easy axis of magnetization $A_e$ and the reverse magnetic field $H_d$ is reduced to a very low value. Consequently, the hysteresis becomes small. As is evident from the above, it is preferred to achieve the intermittent excitation in case of high sensitivity magnetic field detection.

As is apparent from the foregoing detailed description, in the parametric magnetic sensor, the second harmonic voltage is generated across the oscillation winding 2 with a phase depending on the polarity of the external magnetic field cause by the presence of the external magnetic field applied in the lengthwise direction of the magnetic wire 1. This second harmonic voltage is applied to the balanced synchronous detector 7, if necessary, through the tuning amplifier 5 tuned with the second harmonic frequency. On the other hand, a voltage of an excitation frequency $f$ is derived from the excitation power source 4 and applied to the frequency multiplier 6 to obtain a voltage of a frequency $2f$, which is applied as a frequency-and-phase reference signal to the balanced synchronous detector 7.

Figure 4A:
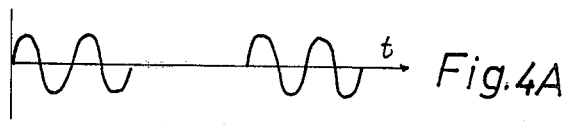
FIGS. 4A, 4B, 4C and 4D are waveform diagrams explanatory of the operation of the system of this invention up to the stage of a synchronous detector therein.
Figure 4B:
Figure 4C:
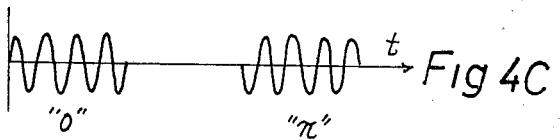
Figure 4D:

FIGS. 4A to 4D show waveform diagrams explanatory of the operation of the circuit up to the stage of the synchronous detector 7. FIG. 4A shows the excitation waveform from the excitation power source 4; FIG. 4B shows the waveform of the external magnetic field of a frequency sufficiently lower than that of the excitation waveform; and FIG. 4C shows the output waveform of the resonance circuit, whose oscillation phase is 0 or $\pi$ depending on the polarity of the external magnetic field. FIG. 4D shows the output waveform of the balanced synchronous detector 7.

Figure 5A:
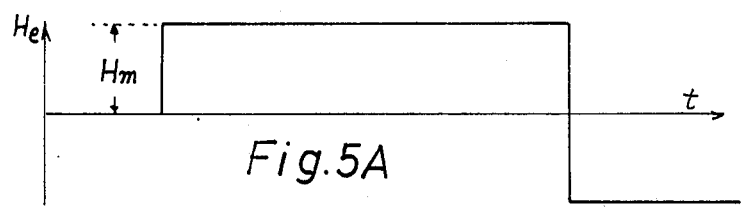
FIGS. 5A and 5B are waveform diagrams explanatory of the operation of a negative feed back loop employed in the system of this invention.
Figure 5B:
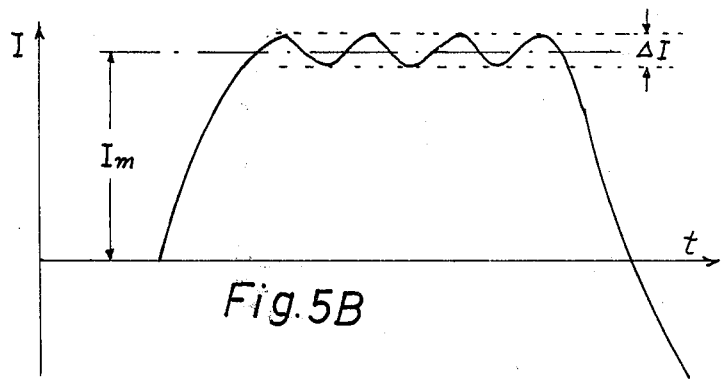

In FIG. 1, the output signal of the balanced synchronous detector 7 is integrated by the integrator 8 whose integration constant is shorter than the repetition period of the output signal, and the integrated output is applied to the DC amplifier 9 to be thereby amplified to have a suitable value as an input to the synchronous phase detector 13 of the subsequent stage. It is a matter of course that, where a sufficient output can be obtained from the balanced synchronous detector 7, the DC amplifier 9 is not necessary. Now, when the output of the DC amplifier 9 is converted by the amplifier 10 into a current I proportional to the output of the DC amplifier 9 and supplied to the oscillation winding 2, a magnetic field corresponding to the above output is generated in the magnetic wire 1 in its axial direction. By suitably determining the direction in which the current I is flowed, a magnetic field can be generated in a direction opposite to the external magnetic field. When the direction of the current I is determined to be such a direction, the circuit connecting from the amplifier 10 to the oscillation winding 2 has a negative feedback action and serves in such a manner that the magnetic field established by the current I and the external magnetic field may become equal in intensity to each other. FIGS. 5A and 5B schematically show this operation. FIG. 5A shows the waveform of the external magnetic field and FIG. 5B shows the waveform of the current I corresponding thereto. Assuming that the external magnetic field change to be of such a rectangular waveform as shown in FIG. 5, the negatively fed back current I corresponding thereto gradually increases due to the time constant $\tau_1$ of the integration circuit 8 as illustrated and fluctuates with a deviation width $\Delta I$ in the vicinity of a current value $I_m$ corresponding to a constant value $H_m$ of the external magnetic field. This oscillation is caused by the presence of the hysteresis characteristic between the external magnetic field intensity and the phase of the second harmonic oscillation voltage described with reference to FIG. 3 and by the influence of the time constant $\tau_1$ of the integration circuit 8. If the hysteresis loop is small, the deviation width $\Delta$ I is also small. If the time constant $\tau_1$ of the integration circuit 8 is determined to be sufficiently shorter than the period $T_s$ of the AC signal magnetic field to be detected and if a magnetic wire has a small hysteresis loop, the current waveform and the output waveform of the DC amplifier 9 obtained are each proportional to the external magnetic field.

Further, the operation of the circuit subsequent to the detector 13 will be described in detail. The external magnetic field $H_e$ applied to the oscillation winding 2 can be represented as the sum of the AC signal magnetic field $H_s$ of the repetitive period $T_s$, a DC noise magnetic field $H_{Ndc}$ such as earth magnetism and other fluctuating noise magnetic field $H_{NAC}$. As is evident from the foregoing description, the output of the DC amplifier 9 is proportional to the external magnetic field $H_e$, so that this output includes the component of the repetition period $T_s$, the DC component and the fluctuating component. A signal magnetic field detecting in a system of much noise such that $(H_{NAC} + H_{Ndc}) + H_s$ has a value close to 1 and instantaneously exceeds 1 will now be considered. In a case where the signal magnetic field has a constant repetition period, a synchronous phase detecting system is suitable for the signal detection in such a system.

Figure 6A:
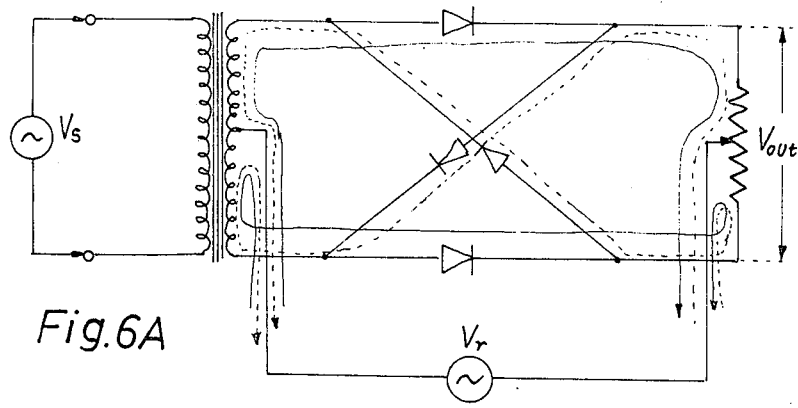
FIGS. 6A and 6B are a circuit diagram and waveform diagrams explanatory of the construction and the operation of a synchronous detector employed in this invention.
Figure 6B:
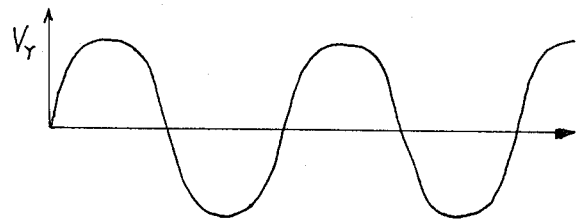
Figure 6B:
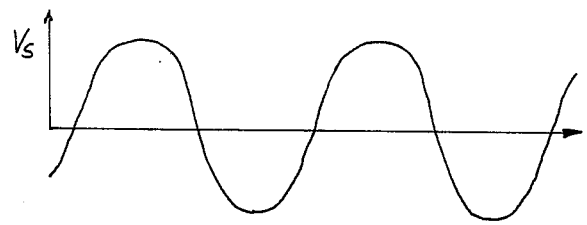
Figure 6B:
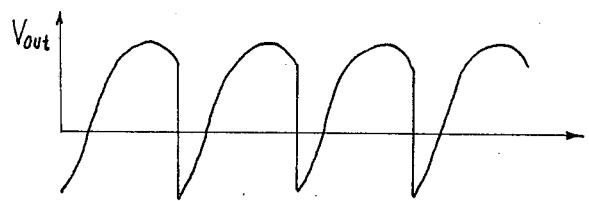

FIG. 6A illustrates one example of a full-wave detection type circuit, for explaining the basic operation of the synchronous phase detecting system. Reference character $V_s$ indicates the maximum amplitude of a signal voltage, and $V_r$ designates the maximum amplitude of a reference voltage. It is basically necessary that $V_r >> V_s$ and that the maximum amplitude $V_r$ is larger than a switching voltage of a switching diode or transistor. In FIG. 6A, the solid line represents the current direction in the positive half cycle of $V_r$, and the broken line represents the current direction in its negative half cycle. FIG. 6B shows the relationships among $V_r$, $V_s$ and $V_{out}$ in the above case. As is apparent from the illustration, in a case where $V_r$ and $V_s$ are coincident with each other in the repetition period and in the phase, the integrated value of $V_{out}$ is maximum. In a case where they are not in agreement with each other in the repetition period, the integrated value of $V_{out}$ is close to zero. In a case where they are displaced by $\pm\pi/2$ in phase, even if they are coincident with each other in the repetition period, the integrated value is zero.

Figure 7:
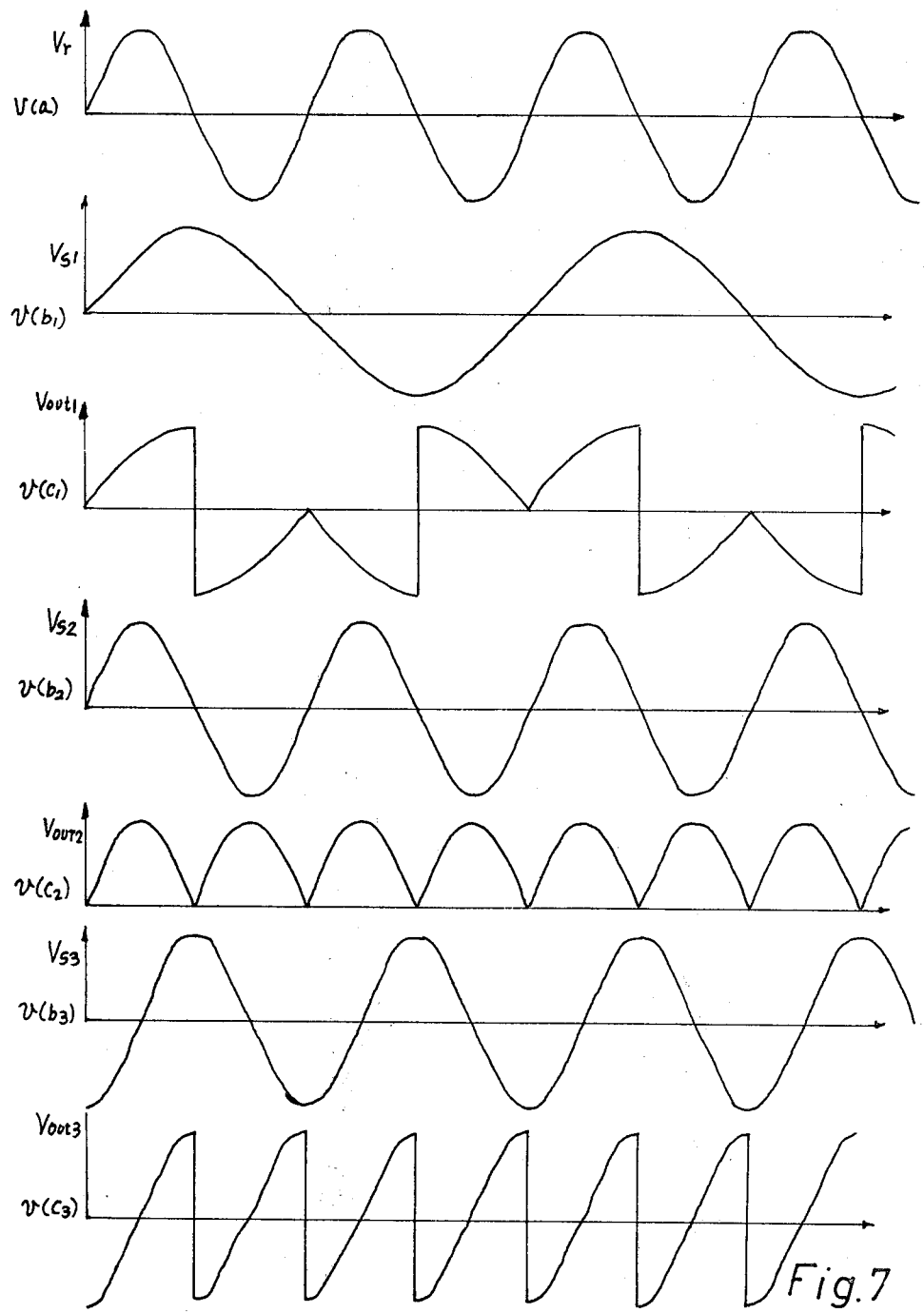
FIG. 7 shows waveform diagrams explanatory of the input waveform and the output waveform of a synchronous detector employed in this invention.

The above relationships are shown in FIG. 7, in which V(a) shows the reference voltage each of; $V(b_1)$ to $V(b_3)$ shows signal voltages corresponding to the reference voltage V(a); and $V(c_1)$ to $V(c_3)$ show output voltages corresponding to the signal voltages $V(b_1)$ to $V(b_3)$, respectively, as are shown in FIG. 6B.

Figure 8:
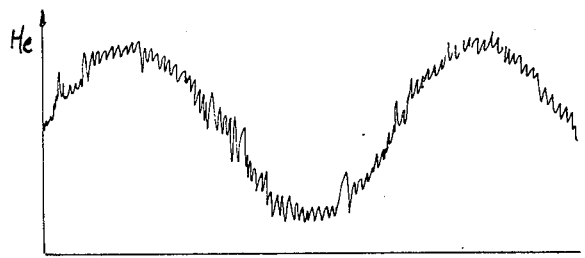
FIG. 8 shows waveform diagrams explanatory of noise reduction caused by a phase detector employed in this invention.
Figure 8:
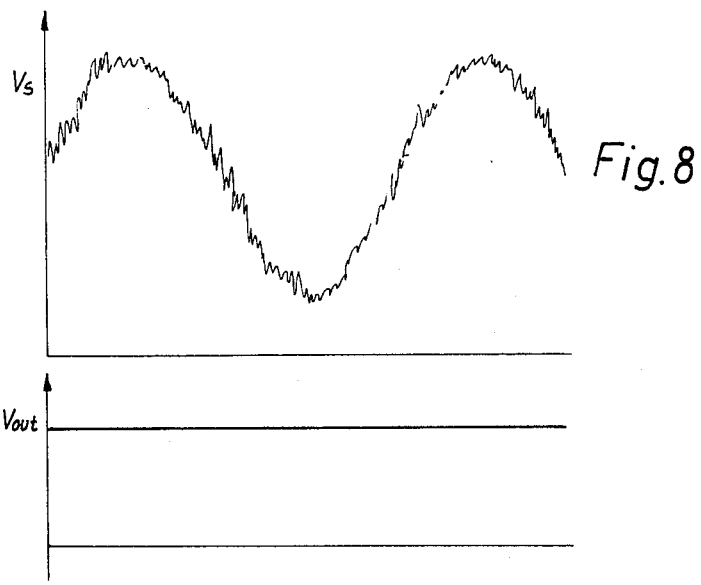

Accordingly, in accordance with such a construction as illustrated in FIG. 1, only that component of the output of the amplifier 9 which is in agreement with the output of the amplifier-phase shifter 14 is detected in the detector 13. Moreover, the other DC component and the noise components which are not coincident with the output of the amplifier 14 including a phase shifter in either one or both of the repetition period and the phase can be extremely decreased by the integration function of the integrator 15 having a suitable integration time constant $\tau_2$. This operation is indicated in FIG. 8, in which the external magnetic field waveform $H_e$, the output waveform $V_s$ of the amplifier 9 and the output waveform $V_{out}$ of the integrator 15 are shown.

Figure 9A:
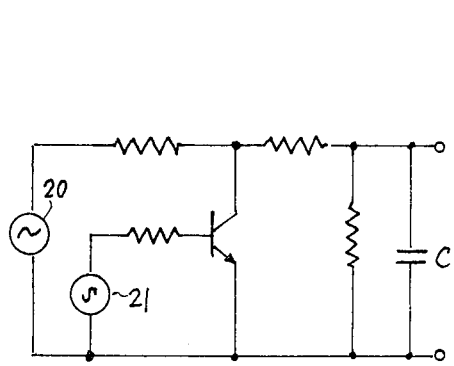
FIGS. 9A, 9B, 9C, 9D, 9E and 9F are circuit diagrams each illustrating an example of a phase detector employed in this invention.
Figure 9B:
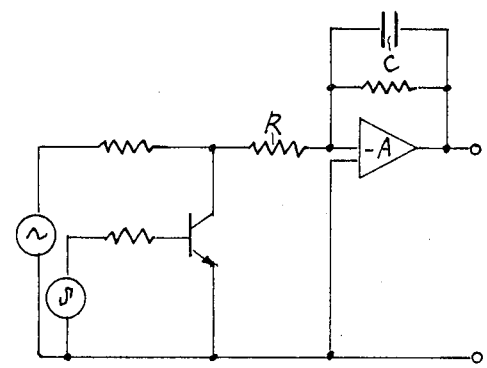
Figure 9C:
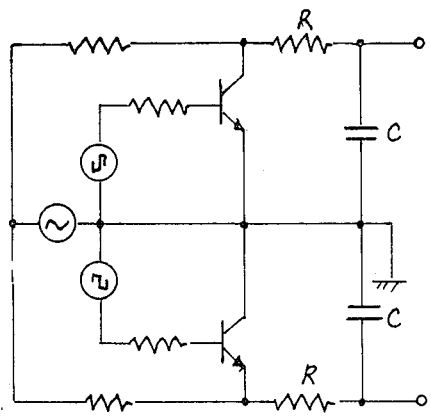
Figure 9D:
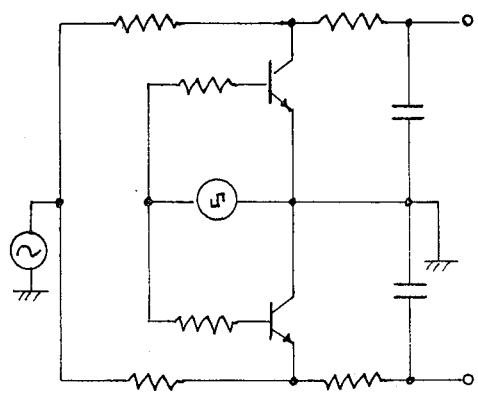
Figure 9E:
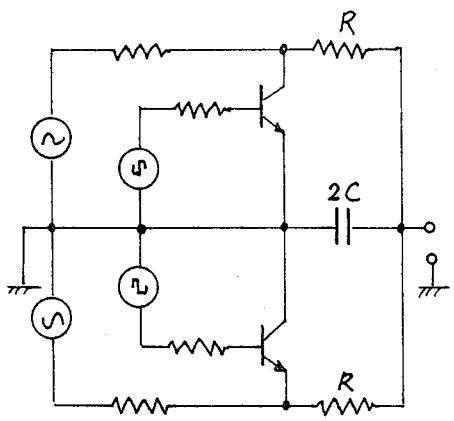
Figure 9F:
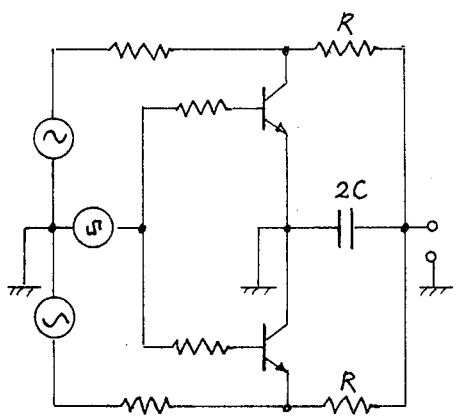

Although this invention has been described in connection with the case where the synchronous phase detector is constructed by an input transformer and a switching diode, the invention is not limited specifically thereto and it is also possible to form the synchronous phase detector by a transistor or a field effect transistor. Further, the used waveforms need not always be full-wave rectified ones but may also be half-wave rectified ones, as depicted in FIGS. 9A and 9B. In FIGS. 9A to 9F, reference numeral 20 indicates a signal wave source; 21 designates a reference wave source.

As has been described in the foregoing, the magnetic field detecting system according to this invention is a system of detecting a weak signal magnetic field at a high SN ratio in a system of much noise such as earth magnetism or other fluctuating noise magnetic fields, so that the system of this invention is suitable for detecting a signal magnetic field having a constant repetition period.

What we claim is:

1. A system for detecting alternating magnetic fields comprising: a magnetic sensing element comprised of a parametrically excited second harmonic oscillator having an output winding for developing an oscillatory output signal therein, an excitation signal source for applying to the magnetic sensing element an alternating exciting current having a frequency higher than a frequency of an alternating magnetic field to be detected, a frequency doubler receptive of the excitation signal for developing an output signal having a frequency equal to twice the excitation signal frequency, a synchronous detector for synchronous detection of an oscillatory output signal of the magnetic sensing element in synchronism with the frequency doubler output signal, a first integrator for integrating the output of the synchronous detector and having an integration time constant sufficiently shorter than the period of the alternating magnetic field to be detected to provide an integrated output having a polarity corresponding to the phase of the oscillation output signal of the magnetic detecting element and an instantaneous magnitude corresponding to the amplitude of the oscillation output signal, means defining a feedback path for negatively feeding back the output of the first integrator to the output winding of the magnetic sensing element, a reference signal generator for generating a reference signal of a frequency substantially equal to the frequency of the alternating magnetic field to be detected, a detector for detecting the output of the first integrator in synchronism with the reference signal, and a second integrator for integrating the output of the detector and having an integration time constant longer than the period of the alternating magnetic field to be detected to obtain an integrated output having an instantaneous magnitude which varies in accordance with the phase-difference between the reference signal and the output of the first integrator and proportional to the amplitude of an AC signal included in the output of the first integrator which is representative of the alternating magnetic field to be detected, whereby the output of the second integrator is employed to detect an alternating field of a frequency close to the frequency of the reference signal.

2. A system for detecting alternating magnetic fields according to claim 1, in which said magnetic sensing element comprises a straight conductor coated with a ferromagnetic thin film and connected to said excitation source for flowing the alternating exciting current into the straight conductor, an oscillation circuit formed by said output winding wound on the straight conductor and a capacitor connected across said output winding to tune to a second harmonic frequency of the excitation current, thereby producing a second harmonic oscillatory output voltage across said output winding.

* * * * *